United States Patent
Yoo et al.

(10) Patent No.: US 10,923,670 B2
(45) Date of Patent: Feb. 16, 2021

(54) METHOD OF FABRICATING RIGID ISLAND PATTERN ON STRETCHABLE LAYER WITH LOW YOUNG'S MODULUS AND STRETCHABLE ELECTRONIC DEVICE PLATFORM USING THE SAME

(71) Applicant: KOREA ADVANCED INSTITUTE OF SCIENCE AND TECHNOLOGY, Daejeon (KR)

(72) Inventors: Seunghyup Yoo, Daejeon (KR); Taehyun Kim, Daejeon (KR); Hanul Moon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/234,977

(22) Filed: Dec. 28, 2018

(65) Prior Publication Data

US 2019/0305233 A1 Oct. 3, 2019

(30) Foreign Application Priority Data

Apr. 3, 2018 (KR) .................. 10-2018-0038508

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 51/0018* (2013.01); *H01L 51/0023* (2013.01); *H01L 2251/5338* (2013.01)

(58) Field of Classification Search
CPC ............ H01L 51/0097; H01L 2924/35–35121
See application file for complete search history.

(56) References Cited

U.S. PATENT DOCUMENTS

2015/0189741 A1 7/2015 Hong et al.
2015/0373831 A1 12/2015 Rogers et al.

FOREIGN PATENT DOCUMENTS

| KR | 10-1404472 B1 | 6/2014 |
| KR | 10-2015-0077899 A | 7/2015 |
| KR | 10-2015-0125797 A | 11/2015 |

OTHER PUBLICATIONS

English Translation of Korean Publication 1020150125797 (translated on Jan. 15, 2020) (Year: 2015).*
KR Office Action in Application No. 10-2018-0038508 dated Sep. 25, 2019.

* cited by examiner

*Primary Examiner* — Amar Movva
(74) *Attorney, Agent, or Firm* — Maschoff Brennan

(57) ABSTRACT

A method of fabricating a rigid island pattern on a stretchable layer having a low Young's modulus and a stretchable electronic device platform using the same are disclosed. The stretchable electronic device platform, which is proposed by the present disclosure and has the rigid island pattern on the stretchable layer having a low Young's modulus, includes a stretchable substrate having a first Young's modulus, a Silbione® layer coated with a stretchable layer having a Young's modulus lower than the first Young's modulus on the stretchable substrate, and a fixed layer which is made of a photoresist such as SU-8 or a UV curable resin and has a Young's modulus higher than the first Young's modulus, and in which the rigid island pattern and the meandering stretchable interconnector pattern are formed on the stretchable layer by a photolithography process.

5 Claims, 8 Drawing Sheets

(a)

(b)

(a)

(b)

METHOD OF FABRICATING RIGID ISLAND PATTERN ON STRETCHABLE LAYER WITH LOW YOUNG'S MODULUS AND STRETCHABLE ELECTRONIC DEVICE PLATFORM USING THE SAME

CROSS-REFERENCE TO RELATED APPLICATION

This application claims priority to and the benefit of Korean Patent Application No. 10-2018-0038508, filed on Apr. 3, 2018, the disclosure of which is incorporated herein by reference in its entirety.

BACKGROUND

1. Field of the Invention

The present disclosure relates to a method of fabricating a rigid island pattern on a stretchable layer having a low Young's modulus and a stretchable electronic device platform using the same.

2. Discussion of Related Art

A technique relating to a stretchable substrate, a stretchable photovoltaic apparatus, and a stretchable device is disclosed in Korean Patent No. 10-1404472B1. Micro-devices are placed on protruding islands, and the adjacent micro-devices are connected to each other through interconnectors. The interconnectors are bent into trenches configured to separate the islands. The present disclosure relates to a stretchable electronic device platform including a stretchable substrate, a layer having a low Young's modulus positioned on a top of the stretchable substrate, and rigid islands and interconnectors configured to connect the rigid islands, which are positioned on the layer having a low Young's modulus, and is characterized in that the rigid islands and the interconnectors are fabricated using the same thin film layer capable of patterning.

When compared with the prior art, the present disclosure provides rigid islands as a platform having a form in which the interconnectors are attached to the layer having a low Young's modulus, and in which main components are formed on the same plane without a three-dimensional structure such as complicated trenches as in the prior art, stretchability is easily ensured, and functional elements can be stably formed on the top of the rigid islands.

U.S. Patent No. 20150373831A1 is the same as the present disclosure in a method of reducing stress and strain applied to the interconnectors using a substrate having a low Young's modulus but uses a separate transfer method in the method of fabricating the islands on which devices are deposited.

In the related art, stretchability is improved by floating the interconnectors in the air, but there are problems in that it is difficult to ensure stability of the interconnectors exposed to the outside, and the degree of difficulty of the process is high. Further, since the transfer method is used in a method of fabricating the rigid islands on the stretchable substrate, an additional process is required, and there is a limitation in pattern accuracy, or the like due to an alignment error accompanying the transfer process.

SUMMARY OF THE INVENTION

The present disclosure is directed to implementing a stretchable electronic device platform, in which a rigid island structure, which is a fixed layer capable of disposing unit elements thereon, and an interconnector configured to electrically connect these unit elements are implemented on the same plane by a batch process, and the fixed layer is directly coated and patterned on a layer having a low Young's modulus, thereby simplifying the fabricating process and still ensuring stretchability of an entire system.

According to an aspect of the present disclosure, there is provided a stretchable electronic device platform including (i) a stretchable substrate having a first Young's modulus, (ii) a stretchable layer which is formed on the stretchable substrate and has a Young's modulus lower than the first Young's modulus, and (iii) a fixed layer made of a material having a Young's modulus higher than the first Young's modulus and composed of rigid islands and narrow and meandering stretchable interconnectors on the stretchable layer. The method proposed in the present disclosure may be different in that a layer having a low Young's modulus is coated on the stretchable substrate, a thin film having a relatively high Young's modulus is coated and patterned on the layer, and the rigid islands and the interconnectors connecting the rigid islands are collectively fabricated.

In one aspect, the stretchable layer having a Young's modulus lower than the first Young's modulus may be formed by a method of directly coating a material such as Silbione® having a very low Young's modulus on the stretchable substrate having the first Young's modulus. The fixed layer composed of the rigid islands and the interconnectors may be formed in a desired pattern through a photolithography process after coating a photoresist such as SU-8 or UV curable resin on the stretchable layer having a low Young's modulus.

When stretching is applied to an entire system, deformation due to the stretch may not occur in the rigid islands of the fixed layer, and the deformation may be concentrated on the stretchable substrate and the stretchable layer. The smaller the Young's modulus of the stretchable layer, the less strain and stress distribution applied to the rigid islands and the stretchable interconnectors during the stretchable electronic device platform is stretched.

After forming the rigid islands and the stretchable interconnectors through a photolithography process, a conductive thin film and a semiconductor thin film may be deposited to fabricate a stretchable electronic device or optoelectronic device. The optoelectronic device may be an organic light-emitting diode or an organic photodiode.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
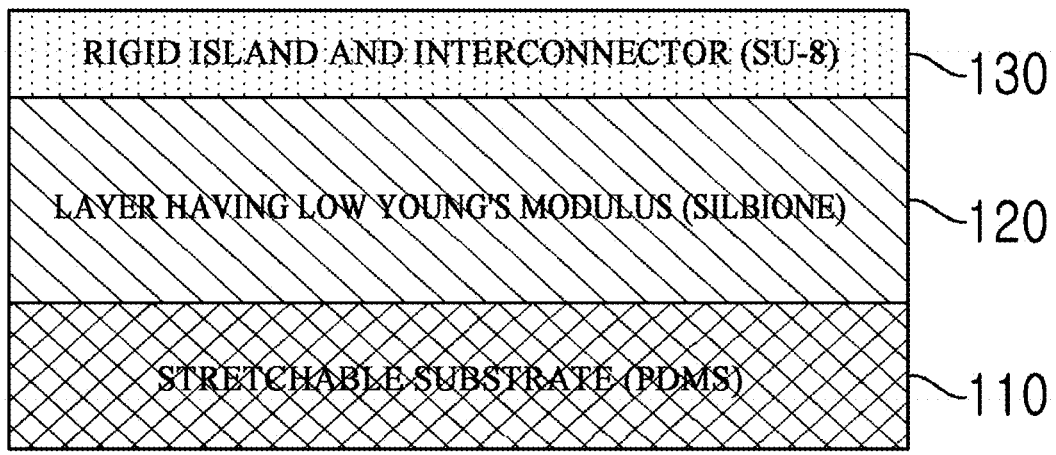
FIG. 1 is a view illustrating a structure of a stretchable electronic device platform having a rigid island pattern on a stretchable layer having a low Young's modulus according to one embodiment of the present disclosure.

The foregoing objects, features, and advantages of the present disclosure will become more apparent from the following detailed description related to the accompanying drawings. However, it should be understood that the present disclosure may be subject to various modifications and embodiments, and hereinafter, particular exemplary embodiments of the present disclosure will be described in detail with reference to the accompanying drawings.

In the drawings, the thicknesses of layers and regions are exaggerated for clarity, and when an element or layer is referred to as being "on" or "upon" another element or layer, the element may not only be directly over the other element or layer, but intervening layers or other elements may exist between the element or layer and the other element or layer. Like reference numerals designate like elements throughout this disclosure. Also, like reference numerals are used for like elements having the same functions within the scope of the same spirit illustrated in the drawings of embodiments.

The detailed description of known functions and configurations incorporated herein will be omitted when it may unnecessarily obscure the subject matter of the present disclosure. Also, numerals (e.g., first, second, and the like) used in the description of this disclosure are merely an identifier for distinguishing one element from another.

Additionally, the suffixes "module" and "unit" for elements used in the following description are given or mixed in consideration of convenience for drafting the specification, and do not have their own distinguishing meaning or role.

Hereinafter, embodiments of the present disclosure will be described in more detail with reference to the accompanying drawings.

FIG. 1 is a view illustrating a structure of a stretchable electronic device platform having patterns of rigid islands and interconnectors on a stretchable layer having a low Young's modulus according to one embodiment of the present disclosure.

The stretchable electronic device platform, which is proposed by the present disclosure and has the patterns of the rigid islands and interconnectors on the stretchable layer having a low Young's modulus, includes a stretchable substrate 110 (for example, Polydimethylsiloxane (PDMS)) having a first Young's modulus, a stretchable layer 120 in which a stretchable material such as Silbione® having a Young's modulus lower than the first Young's modulus is coated on the stretchable substrate, and a fixed layer 130 which is made of a photoresist such as SU-8 or a UV curable resin and has a Young's modulus higher than the first Young's modulus, and in which the rigid island pattern and the meandering stretchable interconnector pattern are formed on the stretchable layer by a photolithography process.

When stretching is applied to an entire system, deformation due to the stretch does not occur in the rigid islands of the fixed layer 130, and the deformation is concentrated on the stretchable substrate 110 and the stretchable layer 120. The smaller the Young's modulus of the stretchable layer 120, the less strain and stress distribution applied to the fixed layer 130 while the stretchable electronic device platform is stretched.

Further, after forming the fixed layer 130 using a photolithography process, a metal and an organic semiconductor may be deposited thereon to fabricate a stretchable organic light-emitting diode (OLED). The OLED is one example of electronic and optoelectronic devices which may be formed on the fixed layer, and in the OLED, various electronic and optoelectronic devices may be formed on the rigid island of the fixed layer 130, and the various electronic and optoelectronic devices may be composed of layers of conductors and semiconductors, insulators, and the like capable of being deposited within a temperature range at which the stretchable substrate 110, the stretchable layer 120, and the fixed layer 130 may withstand.

Figure 2:
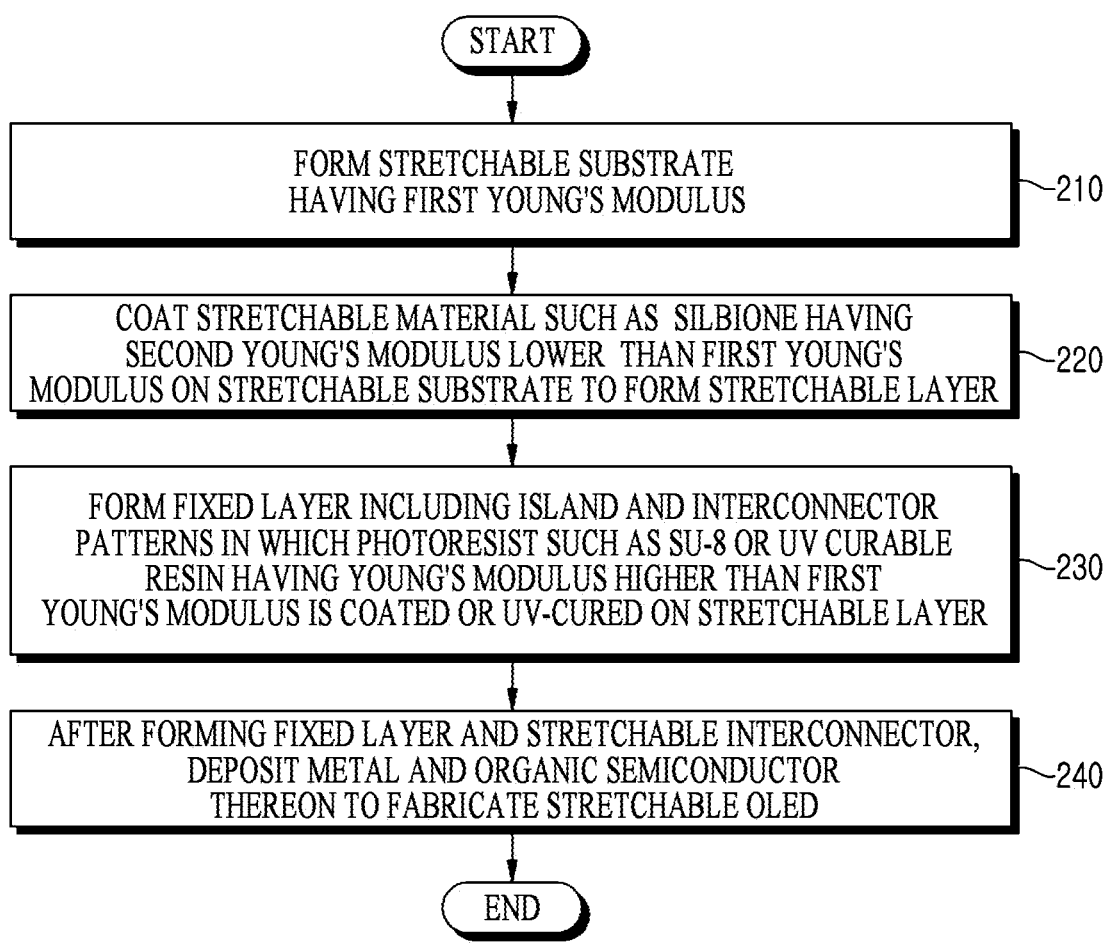
FIG. 2 is a flowchart illustrating a method of fabricating a rigid island pattern on a stretchable layer having a low Young's modulus according to one embodiment of the present disclosure.

FIG. 2 is a flowchart illustrating a method of fabricating a rigid island pattern on a stretchable layer having a low Young's modulus according to one embodiment of the present disclosure.

A method of fabricating rigid island and interconnector patterns constituting a fixed layer on a stretchable layer having a low Young's modulus, which is proposed by the present disclosure, includes forming a stretchable substrate having a first Young's modulus (210), coating a stretchable material such as Silbione® having a second Young's modulus lower than the first Young's modulus on the stretchable substrate to form the stretchable layer (220), forming the fixed layer including the island and interconnector patterns by photoresist-coating and UV-curing using a photoresist such as SU-8 or an UV curable resin having a Young's modulus higher than the first Young's modulus on the stretchable layer (230), and after forming the fixed layer and the stretchable interconnector, depositing a metal and an organic semiconductor thereon to fabricate a stretchable OLED (240).

In operation 210, the stretchable substrate having the first Young's modulus is formed. A stretchable layer with a relatively high Young's modulus (for example, PDMS), which is to be used as a stretchable base substrate, is formed.

In operation 220, the stretchable material having the second Young's modulus lower than the first Young's modulus is coated on the stretchable substrate to form the stretchable layer. Silicon may be used as the material having the low Young's modulus used in the stretchable layer.

As an example, Silbione® may be used as the silicon.

In operation 230, the fixed layer (for example, SU-8) including the islands and the interconnectors is formed on the stretchable layer by patterning the patterns of the rigid fixed layer having a Young's modulus higher than the first Young's modulus through the photoresist coating process and the UV-curing process. The rigid island and interconnector patterns of the fixed layer are collectively fabricated on the same plane rather than on a protruding structure.

In operation 240, after forming the rigid islands and the stretchable interconnectors, the metal and the organic semiconductor are deposited thereon to fabricate the stretchable OLED. The OLED is one example of electronic and optoelectronic devices which may be formed on the fixed layer, and in the OLED, various electronic and optoelectronic devices may be formed on the fixed layer, and the various electronic and optoelectronic devices may be composed of layers of conductors and semiconductors, insulators, and the like capable of being deposited within a temperature range at which the stretchable substrate, the stretchable layer, and the fixed layer may withstand.

By simplifying the fabrication method through the method of coating and patterning the fixed layer including the rigid islands and the interconnectors, on which the devices are deposited, on the stretchable layer having a low Young's modulus, the process simplicity may be ensured, and thus it possible to easily fabricate the stretchable electronic device platform for fabricating stretchable electronic devices. Further, even when a blanket deposition of metals and organic thin films which are components of organic electronic devices is performed without a mask, active areas and inactive areas may be defined at once and may be fabricated simply by using shadowing characteristics of a negative photoresist having an inverse phase structure.

Figure 3:
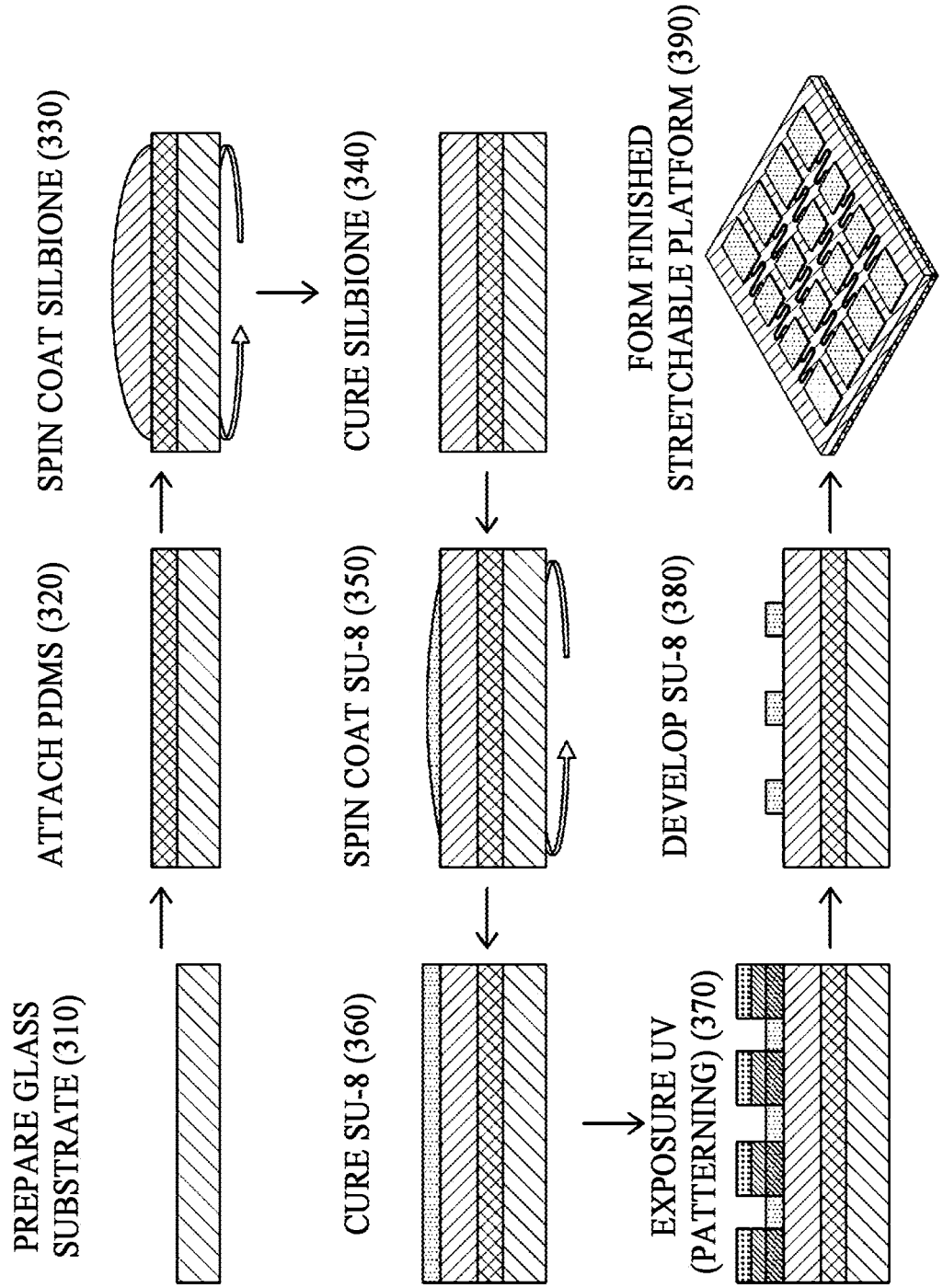
FIG. 3 is a view for describing a fabricating process of a stretchable electronic device platform according to one embodiment of the present disclosure.

FIG. 3 is a view for describing a fabricating process of a stretchable electronic device platform according to one embodiment of the present disclosure.

A material having a Young's modulus lower than a first Young's modulus and having a high stretchability is applied on a stretchable substrate having the first Young's modulus to form a stretchable layer, and then, a layer having a Young's modulus higher than the first Young's modulus is formed by directly coating and patterning a photoresist or UV curable resin on the stretchable layer to fabricate a stretchable electronic device platform according to the embodiment of the present disclosure.

According to the embodiment of the present disclosure, first, a glass substrate is prepared (310), and a stretchable substrate having a relatively high Young's modulus to be used as a stretchable base substrate, for example, PDMS, is attached thereto (320). In addition, on top of that, a stretchable layer having an extremely low Young's modulus, for example, Silbione®, is spin-coated (330), and then subjected to a Silbione curing process (340). On top of that, a rigid fixed layer having a very high Young's modulus, for example, SU-8, is spin-coated (350), and then subjected to an SU-8 curing process (360). In addition, through UV exposure (patterning) (370) and SU-8 development (380) processes, a finished stretchable electronic device platform having rigid islands and stretchable interconnectors is formed (390).

Conventionally, the stretchable electronic device platform is fabricated through a method in which a rigid pattern is formed on a separate substrate and then transferred, but the technique of the present disclosure is relatively simple by using a method of directly coating and patterning the rigid fixed layer on the stretchable layer having a low Young's modulus, and it is also advantageous in terms of mass production and yield improvement.

Figure 4:
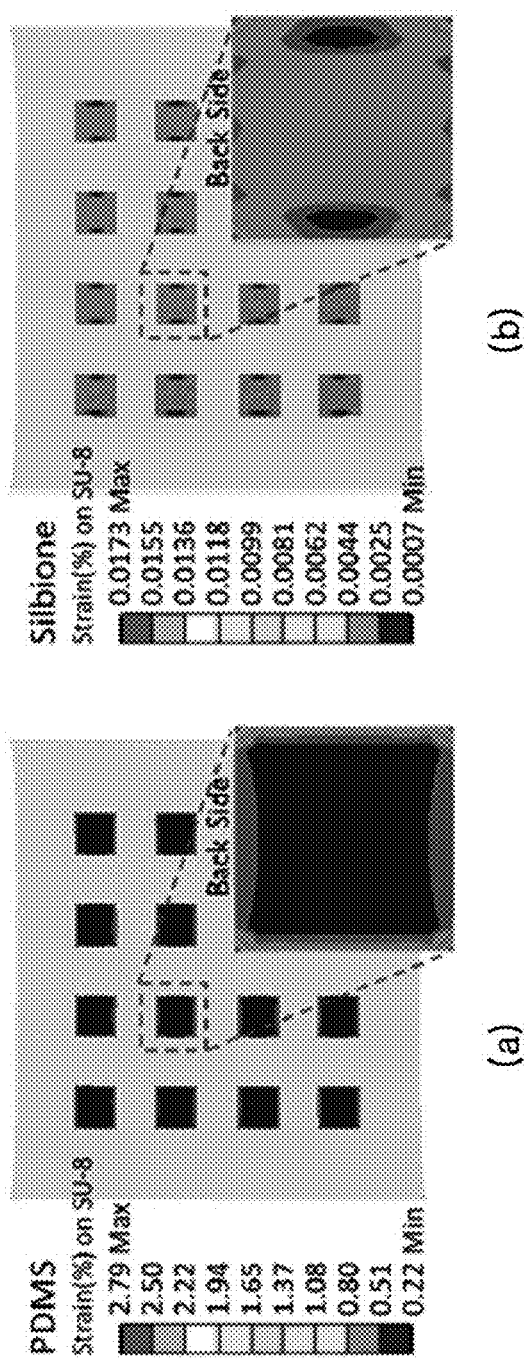
FIGS. 4 to 6 are views for describing a function of the stretchable layer having a low Young's modulus according to one embodiment of the present disclosure.
Figure 5:
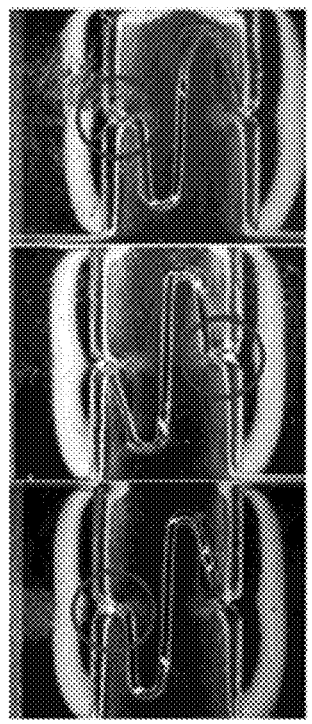
Figure 5:
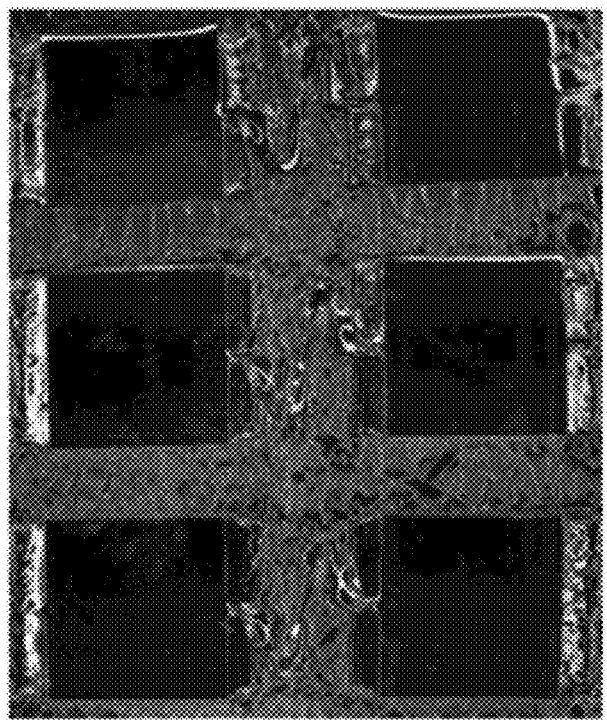
Figure 6:
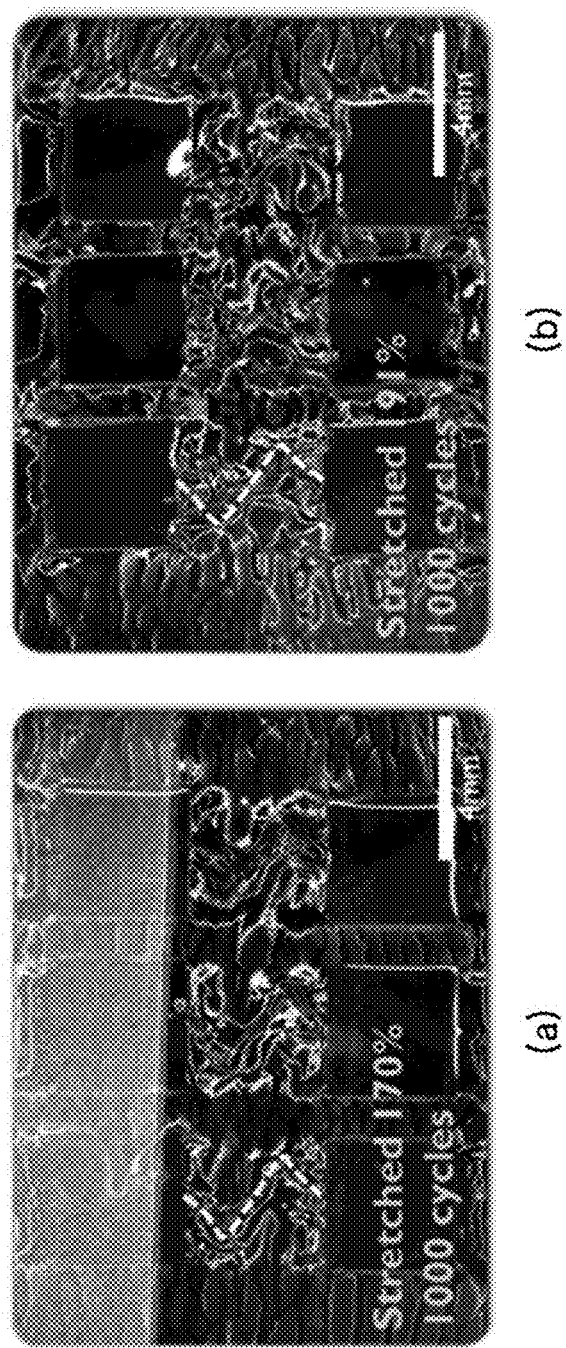

FIGS. 4 to 6 are views for describing a function of the stretchable layer having a low Young's modulus according to one embodiment of the present disclosure.

FIG. 4 shows simulation results using a simulation program of ANSYS®, and FIG. 4A shows that the maximum strain applied to SU-8 is 2.8% when PDMS is stretched by 10% after placing quadrangular shaped islands made of SU-8 on PDMS having a relatively high Young's modulus. FIG. 4B shows that the maximum strain applied to SU-8 is 0.0173% when Silbione® is stretched by 10% after placing the quadrangular shaped islands made of SU-8 on Silbione® having a relatively low Young's modulus. It may be seen that low stress and strain are applied to the rigid islands deposited on the layer having a low Young's modulus.

FIG. 5A is a view showing a case in which shearing occurs when the interconnector is stretched by 58% in PDMS having a Young's modulus of 1.6 MPa according to one embodiment of the present disclosure and FIG. 5B is a view showing a case in which shearing occurs when the interconnector is stretched by 146% in Silbione® having a Young's modulus of 3.0 kPa according to one embodiment of the present disclosure.

FIG. 6A shows a case in which the interconnector is stretched by 170% in Silbione® having a Young's modulus less than 3.0 kPa, and FIG. 6B shows a case in which the interconnect is stretched by 191% in Silbione® having a Young's modulus less than 3.0 kPa. The Young's modulus may be further lowered by lowering a curing agent condition of Silbione®, and accordingly, it is possible to fabricate a stretchable electronic device platform having more excellent stretchability.

According to the embodiment of the present disclosure, when the fixed layer having the rigid islands and the stretchable interconnectors is fabricated on the stretchable layer having a low Young's modulus such as Silbione®, strain and stress applied to the fixed layer may be reduced. The strain and stress applied to the rigid islands and the stretchable interconnectors are reduced as the Young's modulus of the stretchable layer is lowered, and thus the stretchability is enhanced.

Figure 7:
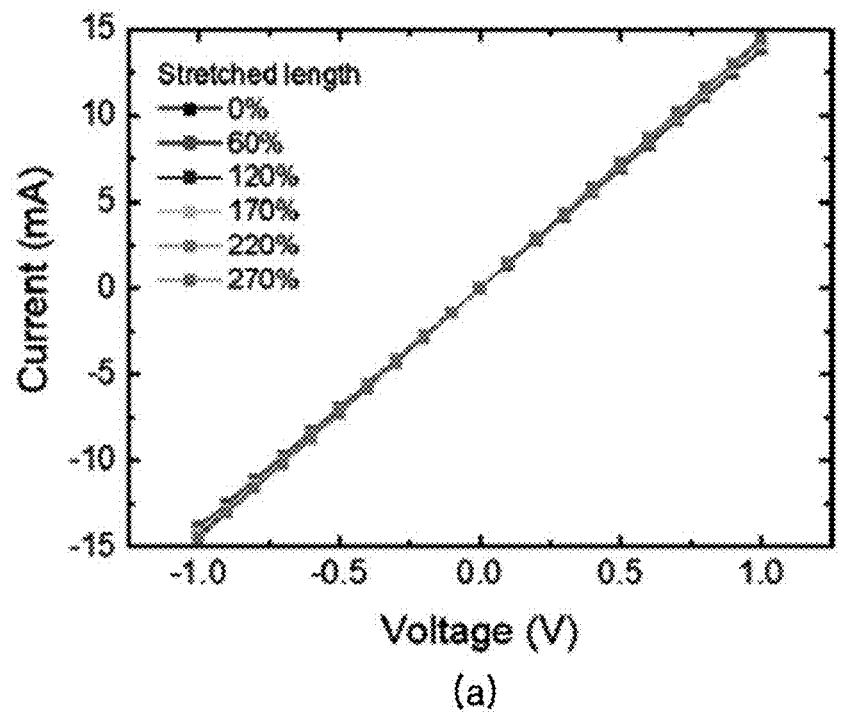
FIG. 7 is a graph showing stretch characteristics of a stretchable electrode fabricated by applying the stretchable electronic device platform according to one embodiment of the present disclosure.
Figure 7:
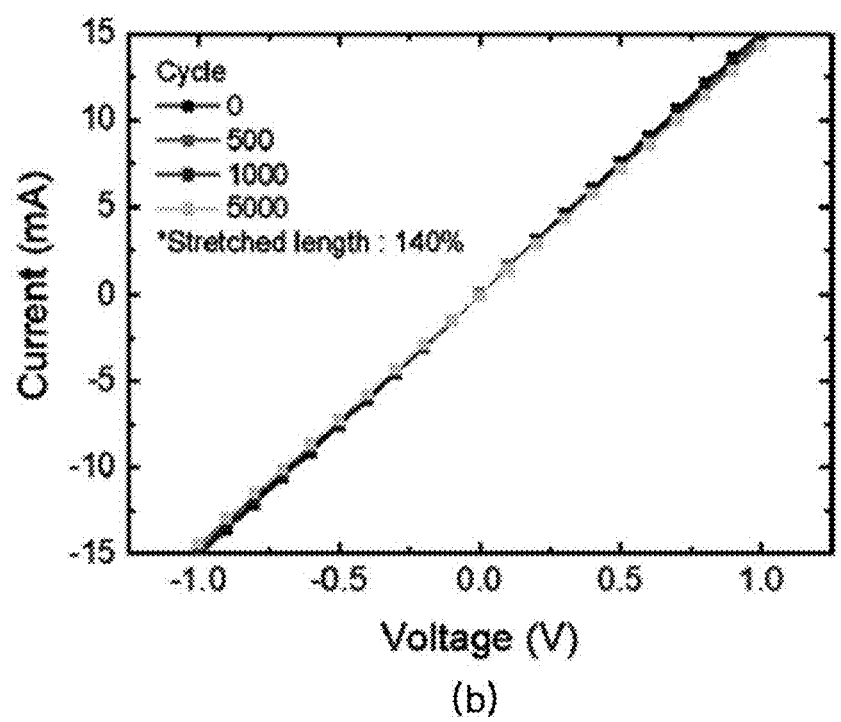

FIG. 7 is a graph showing stretch characteristics of a stretchable electrode fabricated by applying the stretchable electronic device platform according to one embodiment of the present disclosure.

As the embodiment of the present disclosure, rigid islands having a quadrangular shape and stretchable interconnectors formed in a relatively narrow and meandering pattern are fabricated using SU-8 on Silbione®, in which a Young's modulus thereof is adjusted to be low, and then a metal (silver, Ag) is deposited thereon to fabricate a stretchable electrode. In the fabricated stretchable electrode, a change in electrical characteristics is stable within a range of 1% even when the interconnectors are stretched by 270%, the electrical characteristics change within a range of 5% and the electrode operates stably even after the interconnectors are repeatedly stretched 5000 times by 140%.

Figure 8:
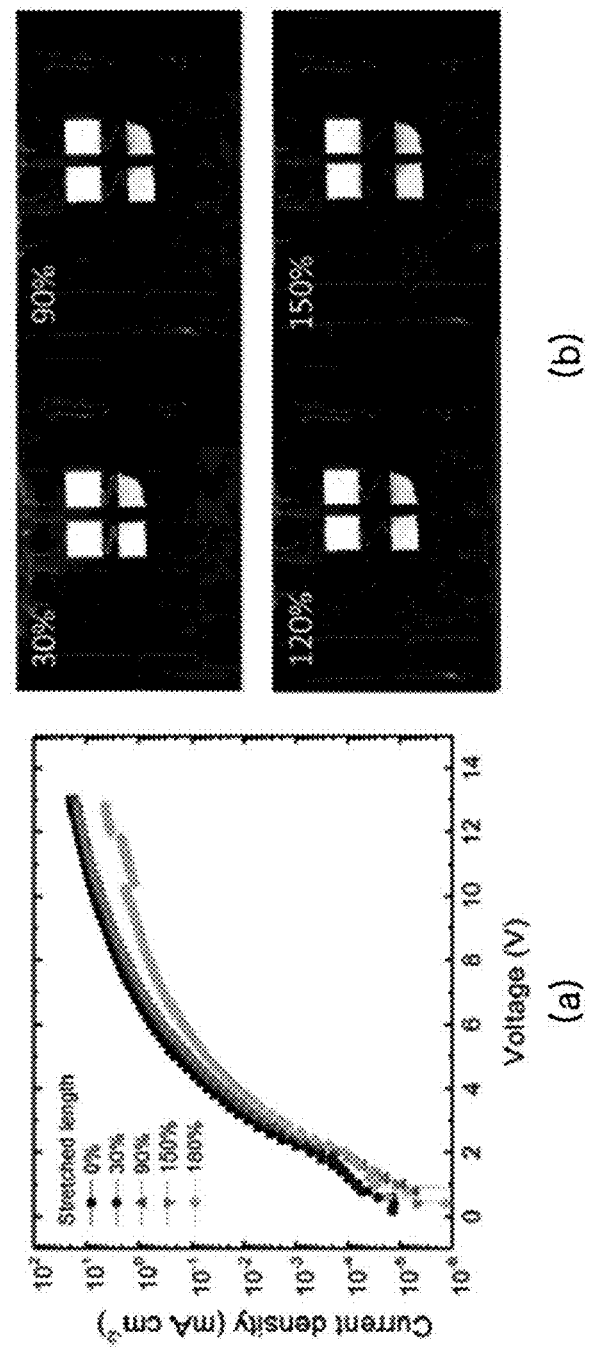
FIG. 8 is a view illustrating a stretchable light-emitting diode (LED) fabricated by applying the stretchable electronic device platform according to one embodiment of the present disclosure.

FIG. 8 is a view illustrating a stretchable light-emitting diode (LED) fabricated by applying the stretchable electronic device platform according to one embodiment of the present disclosure.

As the embodiment of the present disclosure, a stretchable organic light-emitting diode (OLED) may be fabricated by depositing a metal and an organic semiconductor on the stretchable electronic device platform. The fabricated stretchable interconnectors and OLED could emit light without losing characteristics thereof even at a stretch of 140%.

The present disclosure is not limited to the stretchable OLED and may be utilized in the manufacturing of stretchable batteries, solar cells, LEDs, or electronic circuits, and may achieve high yield and a stretchability of about 140% by a simple process.

Accordingly, it may be possible to manufacture a stretchable or attachable curved surface lighting or display. Since the present disclosure may be applied to manufacturing wearable or human body-mounted products, it may also be applied to electronic patches for smart health cares.

In the technique of the present disclosure, since it is manufactured by directly coating on the same plane, the process may be simple, and since the interconnectors are not exposed to the outside, stability may also be ensured.

Further, since strain applied to the interconnectors and the islands may be lowered due to the layer having a low Young's modulus, stretchability may also be enhanced.

In the technique of the present disclosure, it may be possible to simplify the process method by directly coating SU-8, which is a negative photoresist, and since it is possible to fabricate devices by blanket-depositing metals and organic thin films on the islands, the degree of difficulty of the process is very low as compared with the techniques of the existing papers.

Curved smart watches are being released due to the development of flexible displays or flexible electronic devices. The stretchable electronic device platform may provide more freedom in design and convenience than these products and take over the future mobile electronic device market.

In addition, wearable and human body-mounted electronic devices are expected to form a big market by combining with the smart healthcare field, which enables diagnosis and treatment in everyday life.

The fabricating process of the stretchable electronic devices is not standardized, and various methods have been proposed. A platform having higher stretchability may be fabricated with a simple and high yield process when this technique is utilized. Thus, this technique may be applied to the development of various technologies and products, lead to rapid development of next generation technology such as stretchable displays and human body-mounted electronic patches, and be a key technique to gain market advantage.

According to the embodiment of the present disclosure, a simple process can be ensured by simultaneously implementing interconnector and rigid island layers on a stretchable layer having a low Young's modulus, and strain and stress applied to the interconnector or island layer can be reduced using the stretchable layer having a low Young's modulus. Accordingly, an entire system can exhibit excellent stretchability without being greatly affected by the degree of stretchability of the unit electronic devices constituting an island layer. When special materials are used to ensure stretchability of electronic devices themselves, problems such as performance and durability deterioration often occur, but in the present disclosure, the stretchability is mainly ensured by the stretchable layer having a low Young's modulus, and the electronic devices themselves can use the material having excellent characteristics and reliability as they are, so that a system having excellent stretchability, performance, and reliability can be implemented. Particularly, in implementing these advantages, since a simple process of collectively fabricating the island pattern and the interconnector on the stretchable plane substrate is used instead of a method of forming patterns in protruding structure, it is advantageous in terms of mass production and yield improvement. As a result, compared with the related art, it is possible to improve the yield and reduce the cost due to the simplifying of the process and to ensure excellent stretchability and performance despite the simplified process.

It will be apparent to those skilled in the art that various modifications can be made to the above-described exemplary embodiments of the present disclosure without departing from the spirit or scope of the disclosure. Thus, it is intended that the present disclosure covers all such modifications provided they come within the scope of the appended claims and their equivalents.

What is claimed is:

1. A stretchable electronic device platform comprising:
a stretchable substrate having a first Young's modulus;
a stretchable layer disposed on the stretchable substrate, wherein the stretchable layer has a second Young's modulus lower than the first Young's modulus; and
a rigid fixed layer having a third Young's modulus higher than the first Young's modulus and including a rigid island and an interconnector,
wherein one entire surface of the rigid fixed layer contacts with the stretchable layer, and
wherein the rigid fixed layer is fully supported by the stretchable layer such that strain and stress applied to the rigid fixed layer are reduced when the stretchable electronic device platform is stretched.

2. The platform of claim 1, wherein deformation does not occur in the fixed layer, and the deformation is concentrated on the stretchable substrate and the stretchable layer.

3. The platform of claim 2, wherein when stretching is applied to an entire system, the smaller the Young's modulus of the stretchable layer, the less strain and stress distribution of the rigid island and the interconnector.

4. The platform of claim 1, wherein a metal and an organic semiconductor are deposited on the fixed layer to fabricate stretchable organic optoelectronic and electronic devices.

5. The platform of claim 4, wherein in the stretchable organic optoelectronic and electronic devices, various electronic and optoelectronic devices are formed on the rigid island of the fixed layer, wherein the various electronic and optoelectronic devices are composed of layers of a conductor and a semiconductor, an insulator, and the like capable of being deposited within a temperature range at which the stretchable substrate, the stretchable layer, and the fixed layer withstand.

* * * * *